United States Patent
Moon et al.

(10) Patent No.: US 8,368,477 B2
(45) Date of Patent: Feb. 5, 2013

(54) RECEIVER INCLUDING AN LCD TANK FILTER AND METHOD THEREOF

(75) Inventors: Hyun Won Moon, Yongin-si (KR); Hwa Yeal Yu, Bucheon-si (KR)

(73) Assignee: Samsung Electronics Co., Ltd, Suwon-si, Gyeonggi-do (KR)

(*) Notice: Subject to any disclaimer, the term of this patent is extended or adjusted under 35 U.S.C. 154(b) by 100 days.

(21) Appl. No.: 12/844,551

(22) Filed: Jul. 27, 2010

(65) Prior Publication Data
US 2011/0115566 A1    May 19, 2011

(30) Foreign Application Priority Data
Nov. 19, 2009  (KR) .................. 10-2009-0112256

(51) Int. Cl.
*H03B 5/08* (2006.01)
(52) U.S. Cl. ............ 331/167; 331/16; 331/34; 331/179; 327/156; 329/325; 329/327; 329/304; 455/260; 455/307; 455/323
(58) Field of Classification Search .............. 331/167, 331/16, 34, 179; 327/156; 329/325; 455/260
See application file for complete search history.

(56) References Cited

U.S. PATENT DOCUMENTS

| 7,343,146 B2 | 3/2008 | Hallivuori et al. |
| 8,022,778 B2 * | 9/2011 | Nagaraj et al. .......... 331/117 FE |
| 2001/0007151 A1* | 7/2001 | Vorenkamp et al. .......... 725/151 |
| 2007/0123176 A1 | 5/2007 | Han et al. |

FOREIGN PATENT DOCUMENTS

| JP | 2007525877 | 9/2007 |
| JP | 2008-079155 | 4/2008 |
| JP | 2008510333 | 4/2008 |
| KR | 1020050066060 | 6/2005 |
| KR | 1020070033053 | 3/2007 |

* cited by examiner

*Primary Examiner* — Arnold Kinkead
(74) *Attorney, Agent, or Firm* — F.Chau & Associates, LLC

(57) ABSTRACT

A receiver is provided. The receiver includes a differential amplifier amplifying differential input signals input to input terminals and outputting differential output signals through output terminals and an oscillator connected to the output terminals of the differential amplifier. The differential amplifier and the oscillator operate alternatively in response to an enable signal.

12 Claims, 6 Drawing Sheets

RECEIVER INCLUDING AN LCD TANK FILTER AND METHOD THEREOF

CROSS-REFERENCE TO RELATED APPLICATIONS

This application claims priority under 35 U.S.C. §119 to Korean Patent Application No. 10-2009-0112256, filed on Nov. 19, 2009, in the Korean Intellectual Property Office, the disclosure of which is incorporated by reference herein in its entirety.

BACKGROUND

Embodiments of the present inventive concept relate to a receiver, and more particularly, to a RF receiver including an LC tank filter insensitive to PVT variation.

In a radio frequency (RF) receiver, a filter may be sensitive to changes in process (P), voltage (V), or temperature (T), and undesired changes from the required frequency properties or characteristics may occur. Accordingly, a need exists for a receiver including a filter that is less sensitive to changes of process, voltage or temperature.

SUMMARY

The present general inventive concept provides a receiver including an LC filter tank insensitive to a change of process, voltage or temperature and an operation method thereof.

An exemplary embodiment of the present inventive concept is directed to a receiver, including a differential amplifier amplifying differential input signals input from input terminals and outputting differential output signals through output terminals and an oscillator connected to the output terminals of the differential amplifier. The differential amplifier and the oscillator operate alternatively in response to an enable signal.

According to embodiments, the receiver further includes a code generator for comparing a first frequency of a signal output from one of the output terminals with a second frequency of a signal output from a phase locked loop each other and adjusting a calibration code and an LC tank filter, which is connected to the input terminals and adjusts each frequency of the differential input signals in response to the calibration code.

According to embodiments, the code generator compares a first divided frequency, which is caused by dividing the first frequency by M, with a second frequency, which is caused by dividing the second frequency by (N*L), and adjusts the calibration code.

The code generator outputs a calibration termination signal when the difference is within K-period of the third frequency, and the oscillator is disabled in response to the enable signal which is inactivated according to the calibration termination signal.

The receiver further includes a first down-mixer, which is enabled in response to the calibration termination signal and outputs first intermediate frequency signals corresponding to differences between each frequency of the differential output signals and each frequency of in-phase differential signals, and a second down-mixer, which is enabled in response to the calibration termination signal and outputs second intermediate frequencies corresponding to differences between each frequency of the differential output signals and each frequency of quadrature phase differential signals.

According to embodiments, the receiver further includes an LC-tank filter, which is connected to the output terminals and adjusts each frequency of the differential output signals in response to a calibration code, and a code generator comparing a first frequency, which is output from one of the output terminals and adjusted by the LC-tank filter, with a second frequency of a signal output from PLL. The oscillator generates an oscillation signal by using negative conductance.

An exemplary embodiment of the present inventive concept is directed to an operation method of a receiver including an LC-tank filter, including generating a calibration code by using a first frequency output from the oscillator and determined by the LC tank filter and a second frequency output from a phase locked loop and adjusting capacitance of the LC tank filter according to the calibration code.

BRIEF DESCRIPTION OF THE DRAWINGS

These and/or other aspects of the present inventive concept will become apparent and more readily appreciated from the following description of the embodiments, taken in conjunction with the accompanying drawings of which.

DETAILED DESCRIPTION OF THE EMBODIMENTS

Reference will now be made in detail to the embodiments of the present general inventive concept, exemplary of which are illustrated in the accompanying drawings.

Figure 1:
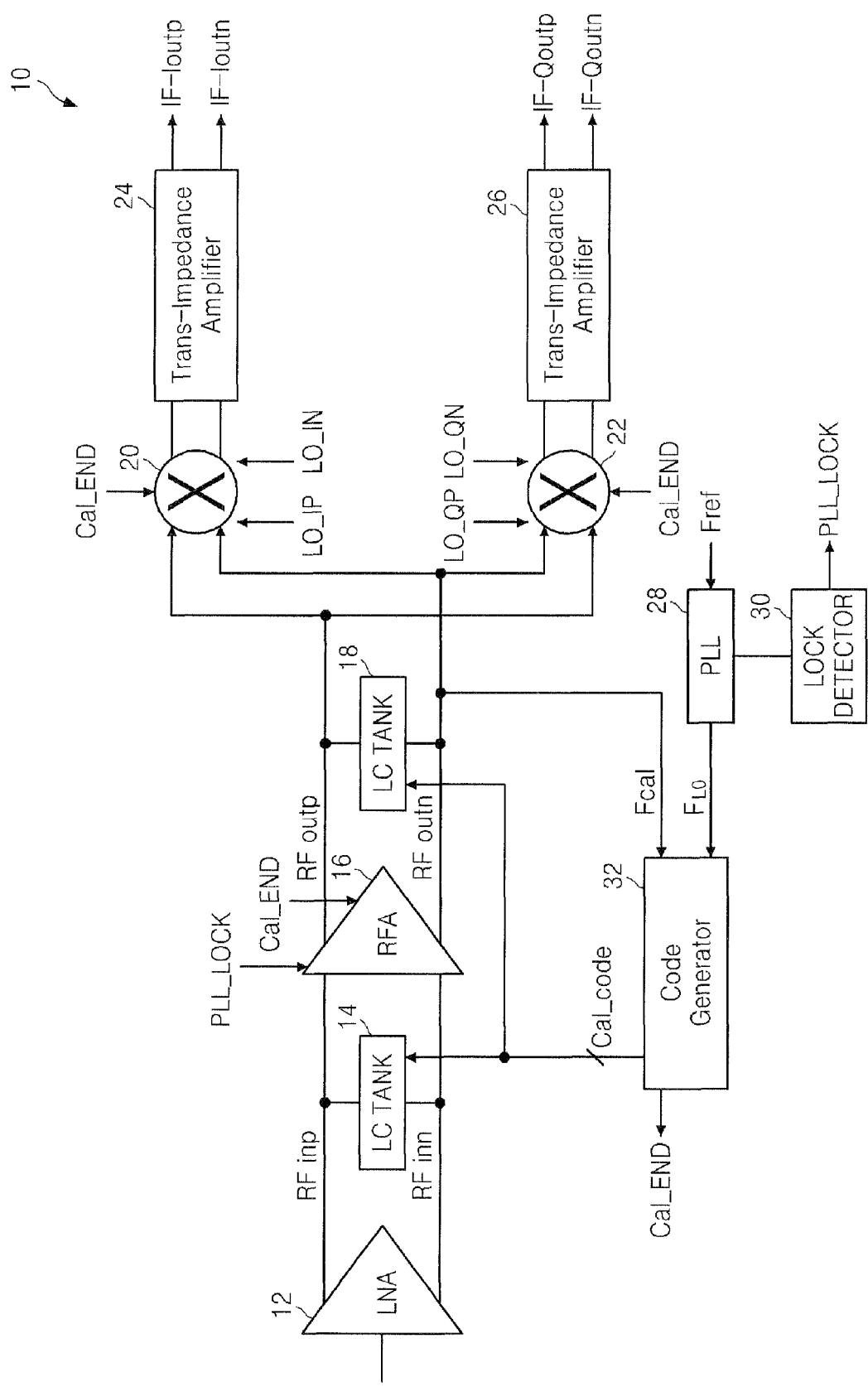
FIG. 1 shows a block diagram of a receiver according to an exemplary embodiment of the present invention.

FIG. 1 shows a block diagram of a receiver according to an exemplary embodiment of the present invention. Referring to FIG. 1, the receiver 10 includes a low noise filter (LNA) 12, a first LC filter 14, a RF amplifier 16, a second LC filter 18 and a code generator 32. The receiver 10 of FIG. 1 may be a part of RF front end of a Global Positioning System (GPS) receiver.

According to embodiments, the receiver 10 may include at least one of the first LC filter 14 and the second LC filter 18. The first LC filter 14 and the second LC filter 18 may be called an LC-tuned filter or an LC tank filter, respectively.

The LNA 12 amplifies signals input through an antenna (not shown) and a pre-select filter and outputs amplified signals RF inp and RF inn. The pre-select filter may be embodied as a band pass filter.

The total capacitance of the first LC filter 14 may be adjusted or calibrated according to a calibration code Cal_code output from the code generator 32. Here, the calibration code Cal_code may include a plurality of bits. For exemplary, a cutoff frequency of the first LC filter 14 may be adjusted according to the calibration code Cal_code.

Figure 3:
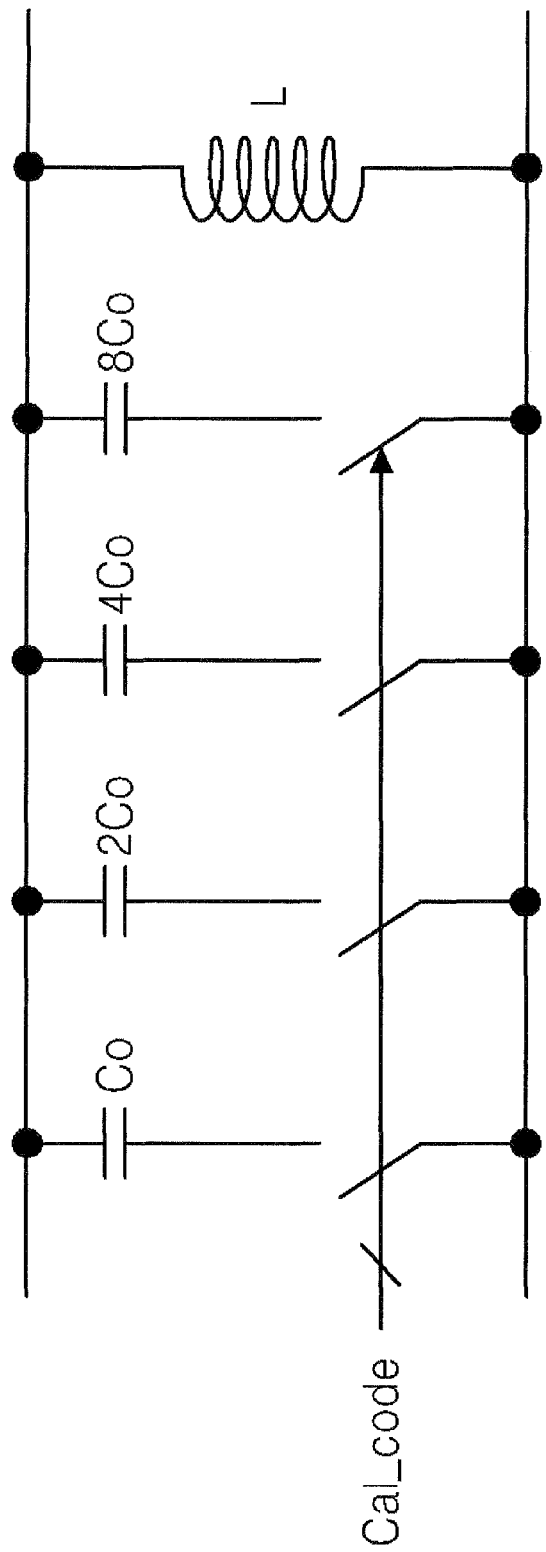
FIG. 3 shows a circuit diagram of an LC-tank illustrated in FIG. 1.

When the first LC filter 14 or the second LC filter 18 is embodied like FIG. 3, capacitance of the first LC filter 14 and capacitance of the second LC filter 18 may be adjusted according to the calibration code Cal_code output from the code generator 32.

For exemplary, the first LC filter 14 or the second LC filter 18 may include an inductor L, a plurality of capacitors C0, 2C0, 4C0 and 8C0 connected in parallel to the inductor L and a plurality of switches. Each of the plurality of switches may be turned on/off according to a level of each bit composing a 4-bit calibration code Cal_code. The first LC filter 14 may be used as an output load of the LNA 12. The first LC filter 14 or the second LC filter 18 may operate regardless of a change (or variation) of at least one of process, voltage and temperature by the calibration code Cal_code.

Figure 2:
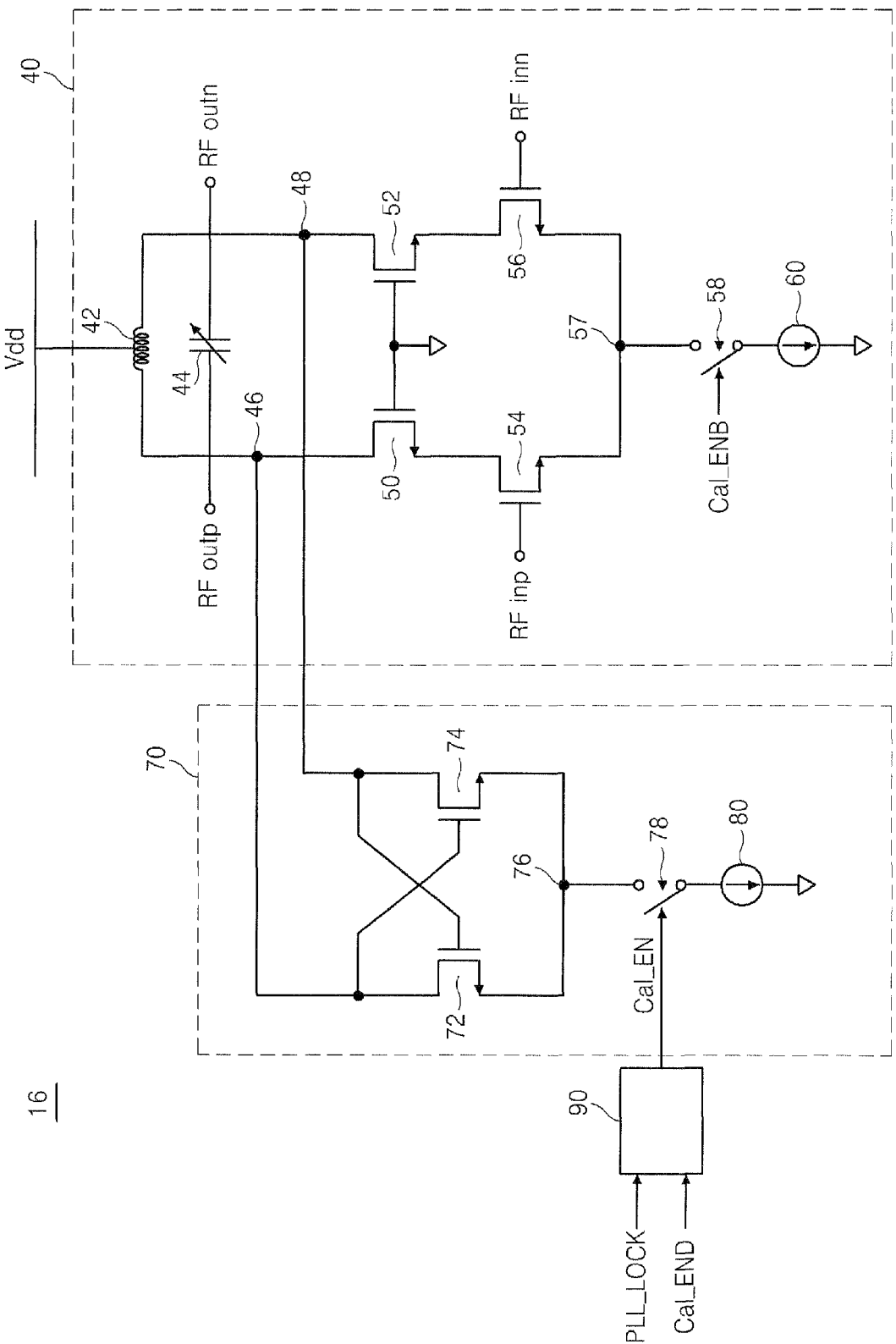
FIG. 2 shows a circuit diagram of a RF amplifier illustrated in FIG. 1.

FIG. 2 shows a circuit diagram of a RF amplifier illustrated in FIG. 1. Referring to FIGS. 1 and 2, the RF amplifier 16 may start a calibration operation in response to a lock signal PLL_LOCK output from a lock detector 30 and perform a normal amplification operation in response to a calibration termination signal Cal_END output from the code generator 32. That is, LC calibration of the first LC filter 14 or the second LC filter 18 during a calibration operation is performed by the calibration code Cal_code output from the code generator 32. According to embodiments, at least one of capacitance and inductance of the first LC filter 14 or the second LC filter 18 may be adjusted by the calibration code Cal_code.

The RF amplifier 16, which may perform a calibration operation or a normal amplification operation, includes a differential amplifier 40, an oscillator 70 and an enable signal generator 90. The differential amplifier 40 may include an inductor 42, a capacitor bank 44, a plurality of transistor 50, 52, 54 and 56, a first switch 58 and a first current source 60. Here, the first switch 58 is embodied as an NMOS transistor, however, it is not restricted thereto.

The capacitor bank 44 may be embodied as a variable capacitor. According to embodiments, total capacitance of the capacitor bank 44 may be adjusted in response to at least one control signal. Each gate of a plurality of transistor 50 and 52 is connected to ground.

Figure 4:
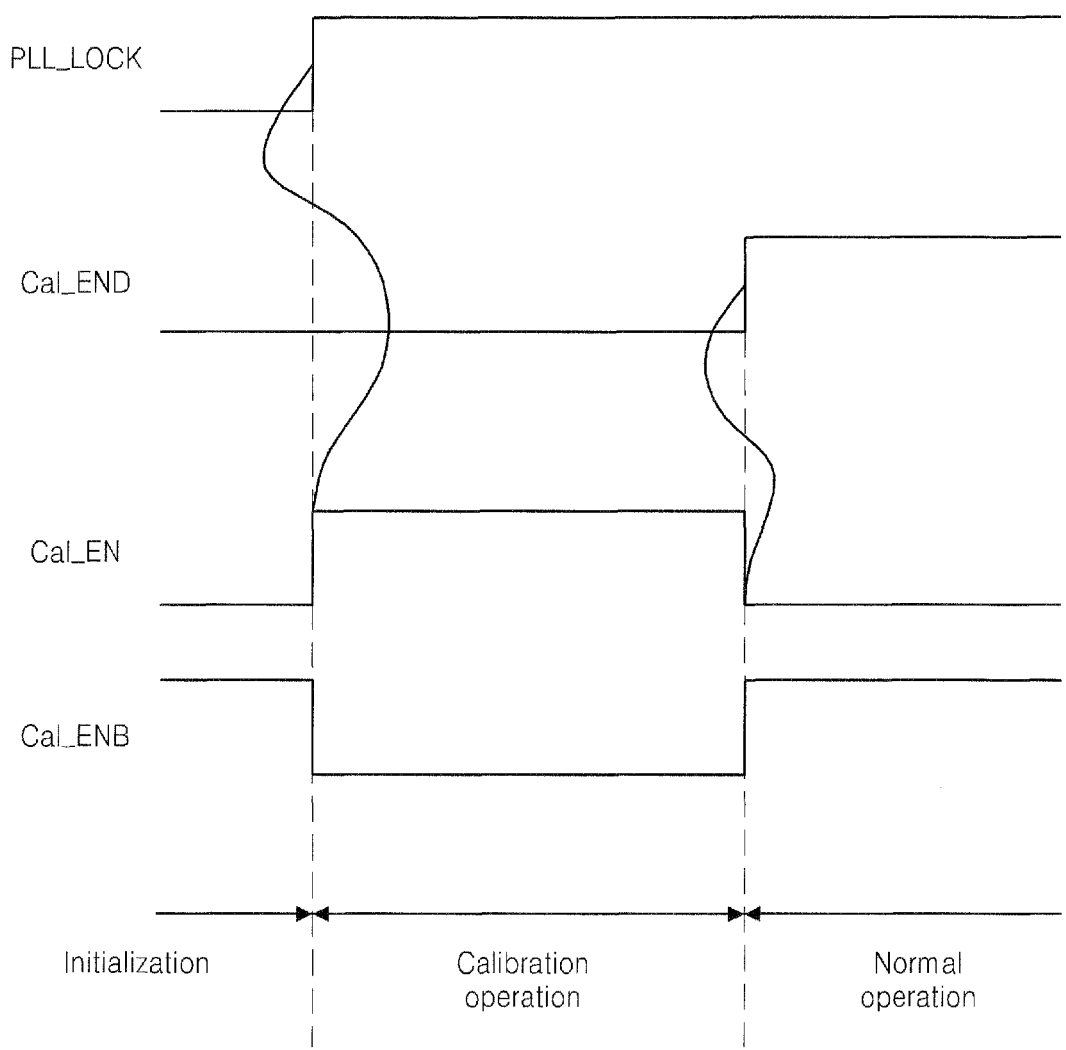
FIG. 4 shows a waveform diagram of control signals for controlling an operation of the receiver illustrated in FIG. 1.

During a normal amplification operation after LC calibration on each LC tank filter 14 and 18 is completed, that is, when a complementary enable signal Cal_ENB illustrated in FIG. 4 is a high level, the differential amplifier 40 may amplify a difference between differential input signals RF Inp and RF Inn, which are input to input terminals 54 and 56, and output differential output signals RF outp and RF outn through output terminals 46 and 48.

The oscillator 70 operating during a calibration operation includes a plurality of cross-coupled transistors 72 and 74, a second switch 78 and a second current source 80. Here, the second switch 78 is illustrated to be embodied as an NMOS transistor, however, it is not restricted thereto.

During the calibration operation, i.e., when the enable signal Cal_EN illustrated in FIG. 4 is a high level, the oscillator 70 connected to output terminals 46 and 48 of the differential amplifier 40 outputs oscillation signals to the output terminals 46 and 48. The oscillation signal may be used to determine capacitance of a capacitor bank of each LC tank filter 14 and 18.

According to embodiments, the oscillator 70 may generate an oscillator signal by using a plurality of cross-coupled transistors 72 and 74 having negative conductance. During the calibration operation, the enable signal generator 90 generates an enable signal Cal_EN having a high level in response to the lock signal PLL_LOCK output from the lock detector 30. Accordingly, the oscillator 70 is enabled in response to the enable signal Cal_EN having a high level and the differential amplifier 40 is disabled in response to a complementary enable signal Cal_ENB having a low level. Here, the enable signal Cal_EN and the complementary enable signal Cal_ENB are complementary signals or differential signals.

During a normal amplification operation, the enable signal generator 90 generates an enable signal Cal_EN having a low level in response to a calibration termination signal Cal_END output from the code generator 32. Here, the oscillator 70 is disabled in response to an enable signal Cal_EN having a low level and the differential amplifier 40 is enabled in response to a complementary enable signal Cal_ENB having a high level. That is, the oscillator 70 only operates during a calibration operation and the differential amplifier 40 only operates during a normal amplification operation. According to embodiments, the receiver 10 may perform an initialization operation, a calibration operation and a normal amplification operation successively.

The second LC filter 18 may be connected to output terminals of the RF amplifier 16 and adjust each frequency of differential output signals output from the RF amplifier 16 in response to the calibration code Cal_code. That is, each frequency of differential output signals of the RF amplifier 16 is determined by the second LC filter 18.

During a calibration operation, the code generator 32 compares a first frequency Fcal, which is output from one of output terminals of the RF amplifier 16 and adjusted by the second LC filter 18, with a second frequency FL0 of a signal output from the PLL 28, and outputs a calibration code Cal_code corresponding to the comparison result to at least one of the first LC filter 14 and the second LC filter 18.

The code generator 32 during a calibration operation may decrease or increase a calibration code Cal_code until the first frequency Fcal coincides with the second frequency FL0 or difference between the first frequency Fcal and the second frequency FL0 is within a certain range. According to embodiments, when aligning or synchronizing a rising edge of the first frequency Fcal with a rising edge of the second frequency FL0, a falling edge of the first frequency Fcal and a falling edge of the second frequency FL0 may be objects to compare.

According to embodiments, the code generator 32 may compare a first divided frequency which is caused by dividing the first frequency Fcal by M (M is a natural number, e.g., 64) with a second divided frequency which is caused by dividing the second frequency FL0 by (N*L) and output a calibration code Cal_code increasing or decreasing according to a result of the comparison. For exemplary, N and L are natural numbers, e.g., N may be 4 and L may be 16. According to embodiments, a period of the first divided frequency and a period of the second divided frequency may be objects to compare. In addition, the code generator 32 may calculate a difference between the first divided frequency, e.g., a period of the first divided frequency, and the second divided frequency, e.g., a period of the second divided frequency, based on a third frequency FDET which is caused by dividing the second frequency FL0 by N, and increase or decrease a calibration code Cal_code according to a calculation result.

For exemplary, when the difference is within K-period of the third frequency FDET, the code generator 32 may output the calibration termination signal Cal_END to the RF amplifier 16 after determining that the first frequency Fcal coincides with the second frequency FL0 each other. Here, K is a natural number. Therefore, the enable signal generator 90 of the RF amplifier 16 generates an enable signal Cal_EN having a low level and a complementary enable signal Cal_ENB having a high level in response to a calibration termination signal Cal_END. Here, the oscillator 70 is disabled and the differential amplifier 40 is enabled. Accordingly, the receiver 10 may perform a normal amplification operation. During a normal amplification operation, the RF amplifier 16 amplifies output signals RFinp and RFinn of a LNA 12 or output signals of the first LC tank filter 14 and transmits amplified signals RFoutp and RFoutn to frequency converters 20 and 22.

The PLL 28 outputs a signal having a second frequency FL0, which has a phase synchronized to a phase of a frequency Fref of an external signal. The lock detector 30 generates a lock signal PLL_LOCK having a high level when a phase of the second frequency FL0 is synchronized to a phase of a frequency Fref of an external signal.

FIG. 1 illustrates that the lock detector 30 is separated from the PLL 28, however, the lock detector 30 may be embodied in the PLL 28.

Each of frequency converters 20 and 22 may convert each frequency of signals amplified by the RF amplifier 16 or each frequency of output signals of the second LC tank filter 18 based on each frequency of signals L0_IP, L0_IN, L0_QP and L0_QN output from a local oscillator. Each of the frequency converters 20 and 22 may perform a frequency conversion operation in response to a calibration termination signal Cal_END having a high level. That is, each of the frequency converters 20 and 22 is disabled during a calibration operation and is enabled during a normal amplification operation.

The first frequency converter 20, which may be embodied as a down mixer, may convert each frequency of signals amplified by the RF amplifier 16 or each frequency of output signals of the second LC tank filter 18 to an intermediate frequency based on each frequency of in-phase differential signals L0_IP and L0_IN output from the local oscillator. A first trans-impedance amplifier 24 may amplify output signals of the first frequency converter 20 and output amplified signals IF-Ioutp and IF-Ioutn. The amplified signals IF-Ioutp and IF-Ioutn are differential signals or complementary signals.

In addition, the second frequency converter 22 which may be embodied as a down mixer may convert each frequency of signals, which is amplified by the RF amplifier 16, or each frequency of output signals of the second LC tank filter 18 into an intermediate frequency based on each frequency of quadrature phase differential signals L0_QP and L0_QN output from the local oscillator. A second trans-impedance amplifier 26 may amplify output signals of the second frequency converter 22 and output amplified signals IF-Qoutp and IF-Qoutn. The amplified signals IF-Qoutp and IF_Qoutn are differential signals or complementary signals.

Figure 5:
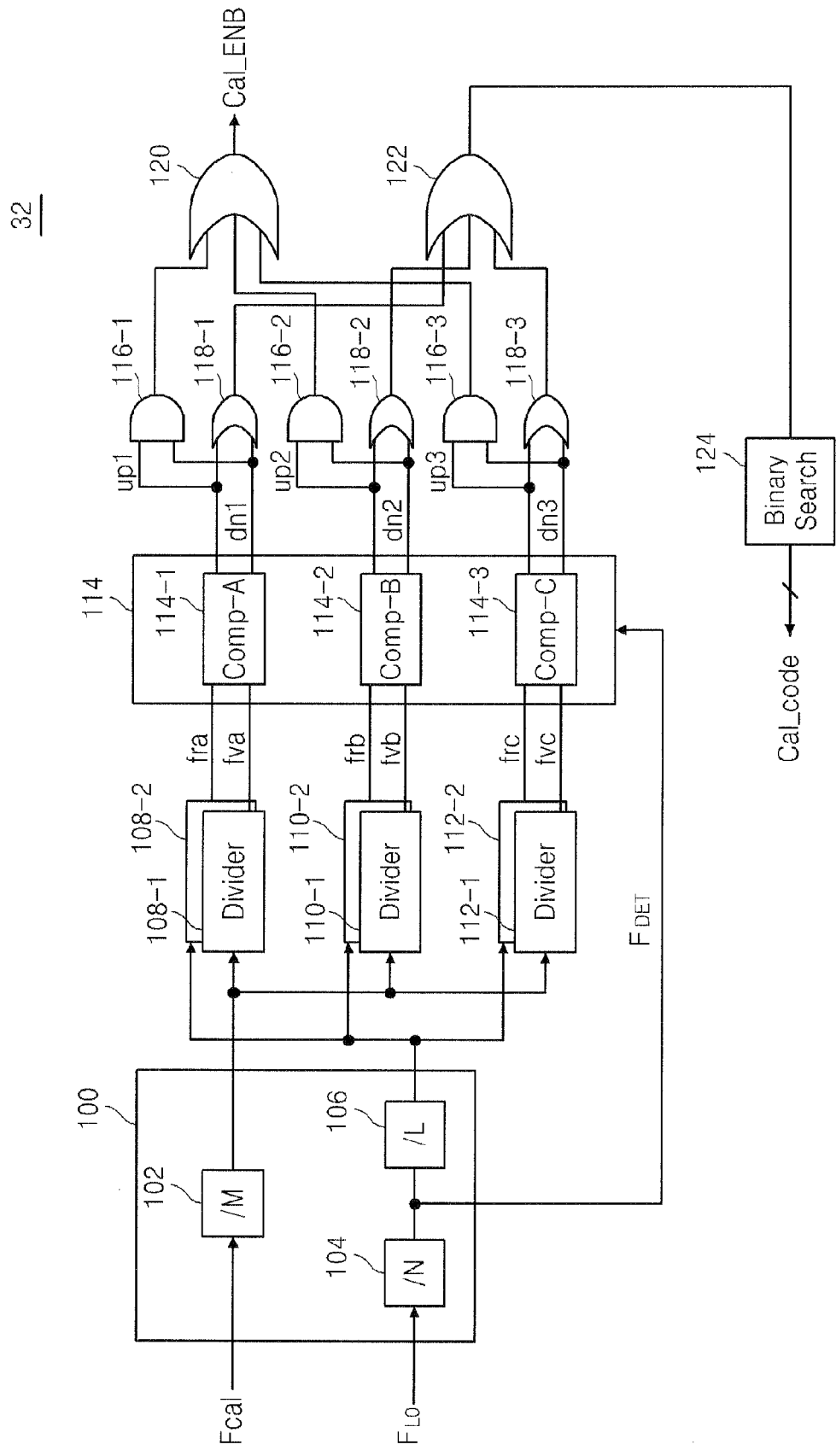
FIG. 5 shows a circuit diagram of a code generator illustrated in FIG. 1.

FIG. 5 shows a circuit diagram of the code generator illustrated in FIG. 1. Referring to FIG. 5, the code generator 32 includes a frequency dividing block 100, a divider block, a comparison block 114, a logic circuit block and a binary search block 124.

The frequency dividing block 100 may divide the first frequency Fcal and the second frequency FL0 respectively and output signals each having a divided frequency. The frequency dividing block 100 includes a first divider 102 for dividing the first frequency Fcal by M, a second divider 104 for dividing the second frequency FL0 by N an a third divider 106 for dividing a third frequency FDET, which is divided by the second divider 104, by L.

Since there may occur an error when comparing the first frequency Fcal with the second frequency FL0 directly in the code generator 32, the code generator 32 lowers frequencies to compare and compares lowered frequencies to prevent such an error generation or occurrence.

The divider block includes a plurality of dividers 108-1, 108-2, 110-1, 110-2, 112-1 and 112-2. Each divider 108-1, 108-2, 110-1, 110-2, 112-1 and 112-2 outputs each divided frequency fra, fva, frb, fvb, frc and fvc by dividing a frequency, divided by the first divider 102, and a frequency, divided by the third divider 106.

The comparison block 114 includes a plurality of comparators 114-1, 114-2 and 114-3. The first comparator 114-1 compares a divided frequency fra output from a divider 108-1 with a divided frequency fva output from a divider 108-2 according to the third frequency FDET and outputs a first up signal up1 and a first down signal dn1 according to the comparison result. For exemplary, the first comparator 114-1 may output the first up signal up1 when the divided frequency fra output from the divider 108-1 leads the divided frequency fva output from the divider 108-2, and output the first down signal dn1 when the divided frequency fra lags behind the divided frequency fva. Of course, it may happen reversely according to embodiments.

When the first frequency Fcal coincides with the second frequency FL0, i.e., a difference between the divided frequency fra and the divided frequency fva is within a certain range, the first comparator 114-1 may output a first up signal up1 having a high level and a first down signal dn1 having a high level.

The second comparator 114-2 compares a divided frequency frb output from a divider 110-1 with a divided frequency fvb output from a divider 110-2 according to the third frequency FDET and outputs a second up signal up2 and a second down signal dn2 according to the comparison result. For exemplary, the second comparator 114-2 may output the second up signal up2 when the divided frequency frb output from the divider 110-1 leads the divided frequency fvb output from the divider 110-2, and output the second down signal dn2 when the divided frequency frb lags behind the divided frequency fvb. Of course, it may be in a reverse way according to embodiments.

When the first frequency Fcal coincides with the second frequency FL0, i.e., difference between the divided frequency frb and the divided frequency fvb is within a certain range, the second comparator 114-2 may output the second up signal up2 having a high level and the second down signal dn2 having a high level. A third comparator 114-3 compares the divided frequency frc output from the divider 112-1 with the divided frequency fvc output from the divider 112-2 and outputs a third up signal up3 and a third down signal dn3 according to the comparison result. For exemplary, the third comparator 114-3 may output the third up signal up3 when the divided frequency frc output from the divider 112-1 leads the divided frequency fvc output from the divider 112-2, and output the third down signal dn3 when the divided frequency frc lags behind the divided frequency fvc.

When the first frequency Fcal coincides with the second frequency FL0, i.e., difference between the divided frequency frc and the divided frequency fvc is within a certain range, the third comparator 114-2 may output the third up signal up3 having a high level and the third down signal having a high level.

In the present invention, leading or lagging may mean that a period of a frequency is shorter or longer than a period of the other frequency among two frequencies to compare. In addition, comparing frequencies may mean to compare a period of each frequency at a comparison time point.

Each up signal up1, up2 and up3 may be used as a control signal for increasing the calibration code Cal_code and each down signal dn1, dn2 and dn3 may be used as a control signal for decreasing a calibration code Cal_code. According to embodiments, it may be embodied in an opposite way.

The logic circuit block may include a first logic circuit block for generating a calibration termination signal Cal_END and a second logic circuit block for controlling an operation of a binary search block 124.

The first logic circuit block includes a plurality of AND gates 116-1, 116-2 and 116-3 and a first OR gate 120. When a signal output from at least one of the plurality of AND gates 116-1, 116-2 and 116-3 is a high level, the first OR gate 120 outputs a calibration termination signal Cal_END having a high level. The second logic circuit block includes a plurality of OR gates 118-1, 118-2 and 118-3 and a second OR gate 122.

The binary search block 124 may perform binary search in response to an output signal of the second OR gate 122, and increase or decrease the calibration code Cal_code according to a result of the performance.

Figure 6:
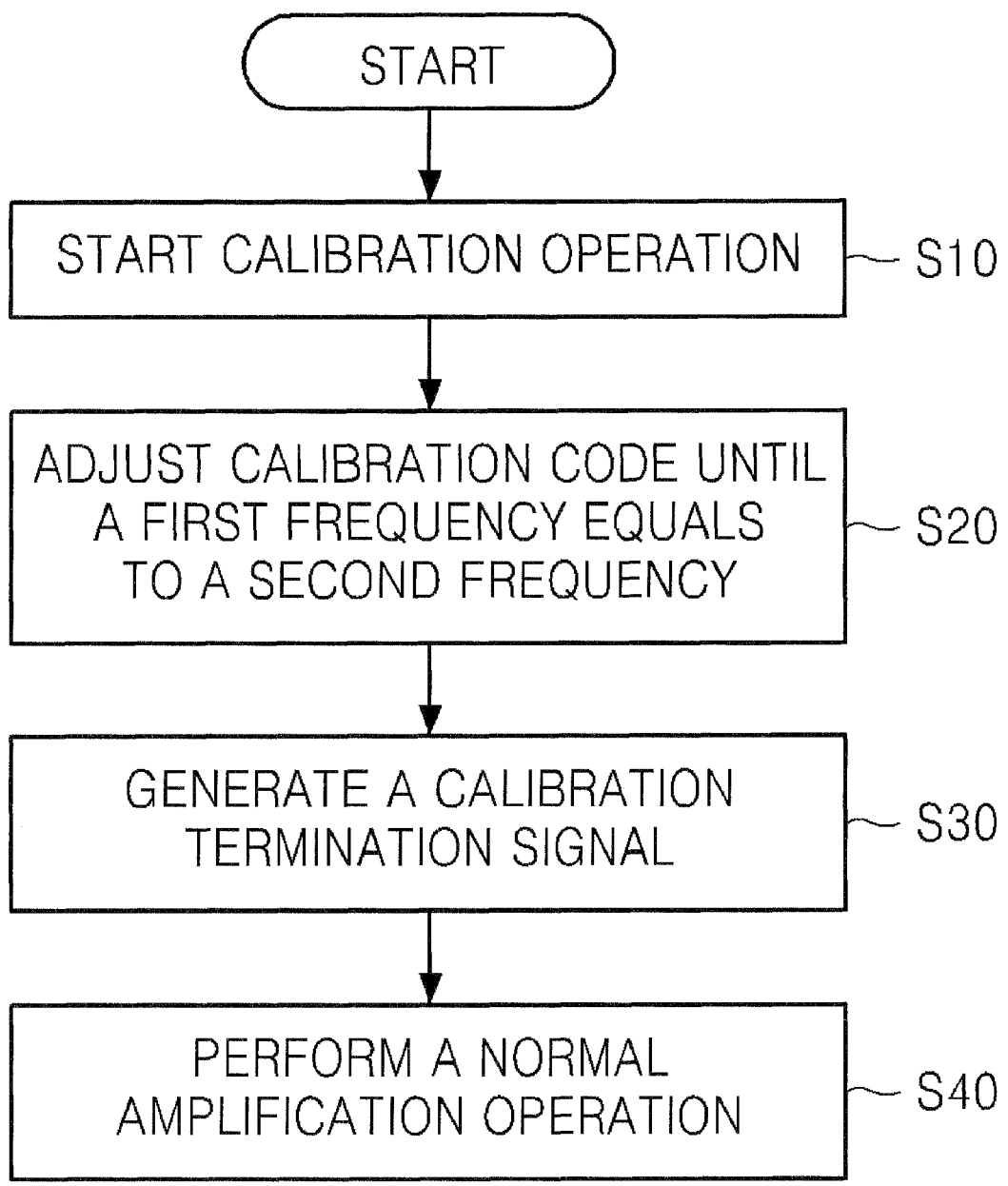
FIG. 6 is a flowchart showing an operation of the receiver illustrated in FIG. 1.

FIG. 6 is a flowchart showing an operation of the receiver illustrated in FIG. 1. Referring to FIGS. 1 to 6, when the PLL 28 is in a lock state during a calibration operation (S10), the lock detector 30 generates a lock detective signal PLL_LOCK having a high level. Accordingly, the enable signal generator 90 of the RF amplifier 16 outputs an enable signal Cal_EN having a high level in response to the lock detective signal PLL_LOCK having a high level. Accordingly, the oscillator 70 generates an oscillation signal. The code generator 32 compares the first frequency Fcal determined by the second LC tank filter 18 with the second frequency FL0 output from the PLL 28. The code generator 32 varies or adjust the calibration code Cal_code until the first frequency Fcal equals to the second frequency FL0 or difference between the first divided frequency which is caused by dividing the first frequency Fcal by M and the second divided frequency which is caused by dividing the second frequency FL0 by (N*L) arrives in or fall within a K-period of the third frequency FDET (S20).

When the first frequency Fcal equals to the second frequency FL0 or a difference between the first divided frequency and the second divided frequency is within a K-period of the third frequency FDET, the code generator 32 generates a calibration termination signal Cal_END having a high level (S30). Accordingly, the enable signal generator 90 generates an enable signal having a low level in response to the calibration termination signal Cal_END having a high level. Accordingly, an operation of the oscillator 70 is stopped and an amplification operation of the differential amplifier 40 begins. Accordingly, the differential amplifier 40 of the RF amplifier 16 performs a normal amplification operation (S40).

As described above, the receiver 10 of the present invention may keep a constant Q-factor regardless of a change of process (P), voltage (V), or temperature (T). In a receiver including an LC tank filter according to embodiments of the present invention, using a code generator may keep characteristics of the LC tank filter regardless of PVT changes.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A receiver comprising:
a differential amplifier amplifying different input signals input to input terminals and outputting differential output signals through output terminals;
an oscillator connected to the output terminals of the differential amplifier, wherein the differential amplifier and the oscillator operate alternatively in response to an enable signal;
a code generator for adjusting a calibration code by comparing a first frequency of a signal output from one of the output terminals with a second frequency of a signal output from a phase locked loop; and
an LC tank filter which is connected to the input terminals and adjusts each frequency of the differential input signals in response to the calibration code.

2. The receiver of claim 1, wherein the code generator compares a first divided frequency caused by dividing the first frequency by M with a second divided frequency caused by dividing the second frequency by (N*L) and adjusts the calibration code according to the comparison result.

3. The receiver of claim 2, wherein the code generator calculates a difference between the first divided frequency and the second divided frequency based on a third frequency caused by dividing the second frequency by N and adjusts the calibration code according to the calculation result.

4. The receiver of claim 3, wherein the code generator outputs a calibration termination signal when the difference is within a K-period of the third frequency and the oscillator is disabled in response to the enable signal which becomes inactivated according to the calibration termination signal.

5. The receiver of claim 4, further comprising:
a first down-mixer, which is enabled in response to the calibration termination signal and outputs first intermediate frequency signals corresponding to differences between each frequency of the differential output signals and each frequency of in-phase differential signals; and
a second down mixer, which is enabled in response to the calibration termination signal and outputs second intermediate frequency signals corresponding to differences between each frequency of the differential output signals and each frequency of quadrature phase differential signals.

6. A receiver comprising:
a differential amplifier amplifying differential input signals input to input terminals and outputting differential output signals through output terminals;
an oscillator connected to the output terminals of the differential amplifier, wherein the differential amplifier and the oscillator operate alternatively in response to an enable signal;
an LC tank filter, which is connected to the output terminals and adjusts each frequency of the differential output signals in response to a calibration code; and
a code generator comparing a first frequency, which is output from one of the output terminals and adjusted by the LC tank filter, with a second frequency of a signal output from a phase locked loop and adjusting the calibration code according to comparison result.

7. The receiver of claim 6, wherein the code generator calculates a difference between the first divided frequency and the second divided frequency based on the third frequency which is caused by dividing the second frequency by N and adjusts the calibration code according to the calculation result.

8. The receiver of claim 7, wherein the code generator outputs a calibration termination signal when the difference is within a K-period of the third frequency and the oscillator is disabled in response to the enable signal which becomes inactivated according to the calibration termination signal.

9. The receiver of claim 8, further comprising:
a first down-mixer, which is enabled in response to the calibration termination signal and outputs first intermediate frequency signals corresponding to differences between each frequency of output signals of the LC tank filter and each frequency of in-phase differential signals; and a second down mixer, which is enabled in response to the calibration termination signal and outputs second intermediate frequency signals corresponding to differences between each frequency of output signals of the LC tank filter and each frequency of quadrature phase differential signals.

10. The receiver of claim 1, wherein the oscillator generates an oscillation signal by using negative conductance.

11. A method for operating a receiver including an LC tank filter, the method comprising:
   generating a calibration code by using a first frequency, which is output from an oscillator and determined by the LC tank filter, and a second frequency output from a phase locked loop;
   adjusting capacitance of the LC tank filter according to the calibration code;
   generating a first divided frequency caused by dividing the first frequency by M;
   generating a second divided frequency caused by dividing the second frequency by N;
   generating a third divided frequency caused by dividing the second divided frequency by L; and
   calculating a difference between the first divided frequency and the third divided frequency based on the second divided frequency and outputting a calibration termination signal when the calculated difference is within a K-period of the second frequency,
   wherein the oscillator is disabled in response to the calibration termination signal.

12. The method of claim 11, further comprising:
   amplifying differential input signals by using a differential amplifier which is enabled in response to the calibration termination signal; and
   converting each frequency of output signals of the differential amplifier by using a frequency converter which is enabled in response to the calibration termination signal.

* * * * *